(12) United States Patent
Wakui et al.

(10) Patent No.: US 10,829,689 B2
(45) Date of Patent: Nov. 10, 2020

(54) METHOD FOR PRODUCING NITRIDE FLUORESCENT MATERIAL, NITRIDE FLUORESCENT MATERIAL AND LIGHT EMITTING DEVICE

(71) Applicant: NICHIA CORPORATION, Anan-sh (JP)

(72) Inventors: Sadakazu Wakui, Tokushima (JP); Kazuya Nishimata, Anan (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/733,633

(22) Filed: Jan. 3, 2020

(65) Prior Publication Data

US 2020/0255730 A1    Aug. 13, 2020

Related U.S. Application Data

(62) Division of application No. 16/117,514, filed on Aug. 30, 2018, now Pat. No. 10,550,324.

(30) Foreign Application Priority Data

Aug. 31, 2017 (JP) ................................. 2017-167127

(51) Int. Cl.
*C09K 11/77* (2006.01)
*H01L 33/50* (2010.01)

(52) U.S. Cl.
CPC ........ *C09K 11/7734* (2013.01); *H01L 33/502* (2013.01); *H01L 33/504* (2013.01); *H01L 2933/0041* (2013.01)

(58) Field of Classification Search
CPC . C09K 11/7734; H01L 33/502; H01L 33/504; H01L 2933/0041
See application file for complete search history.

(56) References Cited

U.S. PATENT DOCUMENTS 8,581,286 B2    11/2013    Lee et al.
8,945,421 B2    2/2015    Lee et al.
(Continued)

FOREIGN PATENT DOCUMENTS

| JP | 2002069442 A | 3/2002 |
| JP | 2009526089 A | 7/2009 |

(Continued)

OTHER PUBLICATIONS

Philipp Pust et al. "Narrow-band red-emitting Sr[LiAl3N4]:Eu2+ as a next-generation LED-phosphor material" Nature Materials, NMAT4012, vol. 13, Sep. 2014.

*Primary Examiner* — Anthony Ho
(74) *Attorney, Agent, or Firm* — Hunton Andrews Kurth LLP

(57) ABSTRACT

Disclosed are a production method for a nitride fluorescent material, a nitride fluorescent material and a light emitting device. The production method is for producing a nitride fluorescent material that has, as a fluorescent material core, a calcined body having a composition containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N, and the method includes preparing a calcined body having the above-mentioned composition, bringing the calcined body into contact with a fluorine-containing substance, and subjecting it to a first heat treatment at a temperature of 100° C. or higher and 500° C. or lower to form a fluoride-containing first film on the calcined body, and forming on the calcined body, a second film that contains a metal oxide containing at least one metal element M2 selected from the group consisting of Si, Al, Ti, Zr, Sn and Zn and subjecting it to a second heat treatment at a
(Continued)

temperature in a range of higher than 250° C. and 500° C. or lower.

8 Claims, 9 Drawing Sheets

(56) References Cited

U.S. PATENT DOCUMENTS

| | | |
|---|---|---|
| 9,546,319 B2 | 1/2017 | Schmidt et al. |
| 2007/0012598 A1 | 1/2007 | Rendall |
| 2012/0037850 A1 | 2/2012 | Lee et al. |
| 2012/0205674 A1 | 8/2012 | Lee et al. |
| 2015/0123155 A1 | 5/2015 | Koninkl |
| 2018/0230376 A1 | 8/2018 | Schmidt et al. |

FOREIGN PATENT DOCUMENTS

| | | |
|---|---|---|
| JP | 2012079883 A | 4/2012 |
| JP | 2013541828 A | 11/2013 |
| JP | 2015526532 A | 9/2015 |
| JP | 2017155209 A | 9/2017 |
| JP | 2017531068 A | 10/2017 |
| JP | 2017214516 A | 12/2017 |

METHOD FOR PRODUCING NITRIDE FLUORESCENT MATERIAL, NITRIDE FLUORESCENT MATERIAL AND LIGHT EMITTING DEVICE

CROSS-REFERENCE TO RELATED PATENT APPLICATION

This is a divisional application of U.S. patent application Ser. No. 16/117,514, filed Aug. 30, 2018, which claims priority to Japanese Patent Application No. 2017-167127, filed on Aug. 31, 2017, the entire disclosure of which is incorporated herein by reference in its entirety.

BACKGROUND

Technical Field

The present disclosure relates to a method for producing a nitride fluorescent material, a nitride fluorescent material and a light emitting device. In this specification, the "fluorescent material" is used in the same meaning as a "fluorescent phosphor".

Description or Related Art

As a fluorescent material that emits light in red and is used in a light emitting device constructed by combining a light emitting diode (hereinafter referred to as "LED") and a fluorescent material, there is a nitride fluorescent material having a composition represented by $SrLiAl_3N_4$:Eu (hereinafter may be referred to as "SLAN fluorescent material"). For example, Patent Literature 1 (PTL 1) and Non Patent Literature 1 (NPL 1) (Philipp Pust et al., "Narrow-band red-emitting $Sr[LiAl_3N_4]$:$Eu^{2+}$ as a next-generation LED-phosphor material" Nature Materials, NMAT4012, VOL13 Sep. 2014) disclose a SLAN fluorescent material having a light emission peak wavelength at around 650 nm.

As disclosed in NPL1, a SLAN phosphor is, for example, produced such that powders of raw materials including lithium aluminum hydride ($LiAlH_4$), aluminum nitride (AlN), strontium hydride ($SrH_2$), and europium fluoride ($EuF_3$) are weighed in a stoichiometric ratio so that 0.4% by mol Eu is mixed. The mixture is placed in a crucible and calcined in a mixed gas atmosphere of hydrogen and nitrogen under an atmospheric pressure at a temperature of 1000° C. for two hours.

CITATION LIST

Patent Literature

PTL1: Japanese Laid-open Patent Publication No. 2015-526532

Non Patent Literature

NPL1: Philipp Pust et al. "Narrow-band red-emitting $Sr[LiAl_3N_4]$:$Eu^{2+}$ as a next-generation LED-phosphor material" Nature Materials, NMAT4012, vol. 13, September 2014.

SUMMARY

However, it is known that the SLAN fluorescent material readily degrade depending on external environments. It is desired to further improve the durability of a light emitting device that uses such a SLAN fluorescent material.

An object of the present disclosure is to provide a method for producing a nitride fluorescent material whose degradation by external environments is suppressed, and to provide a light emitting device excellent in durability.

The present disclosure includes the following embodiments.

A first embodiment of the present disclosure is a method for producing a nitride fluorescent material that contains, as a fluorescent material core, a calcined body having a composition containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, optionally Si, and N; the method including preparing a calcined body having the above-mentioned composition, bringing the calcined body into contact with a fluorine-containing substance, and subjecting the calcined body to a first heat treatment at a temperature in a range of 100° C. or higher and 500° C. or lower to form a fluoride-containing first film on the calcined body, and forming on the calcined body, a second film that contains a metal oxide containing at least one metal element M2 selected from the group consisting of Si, Al, Ti, Zr, Sn and Zn and subjecting the calcined body to a second heat treatment at a temperature in a range of higher than 250° C. and 500° C. or lower.

A second embodiment of the present disclosure is a nitride fluorescent material having, on the surface of a fluorescent material core containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N, a first film containing a fluoride, and a second film containing a metal oxide that contains at least one metal element M2 selected from the group consisting of Si, Al, Ti, Zr, Sn and Zn, wherein:

the first film contains the metal element M2 and the amount of the metal element M2 contained in the second film is larger than the amount of the metal element M2 contained in the first film.

A third embodiment of the present disclosure is a light emitting device including the above-mentioned nitride fluorescent material and an excitation light source.

According to the embodiments of the present disclosure, there can be provided a method for producing a nitride fluorescent material whose degradation by external environments is suppressed, and a light emitting device excellent in durability.

DETAILED DESCRIPTION

Figure 1:
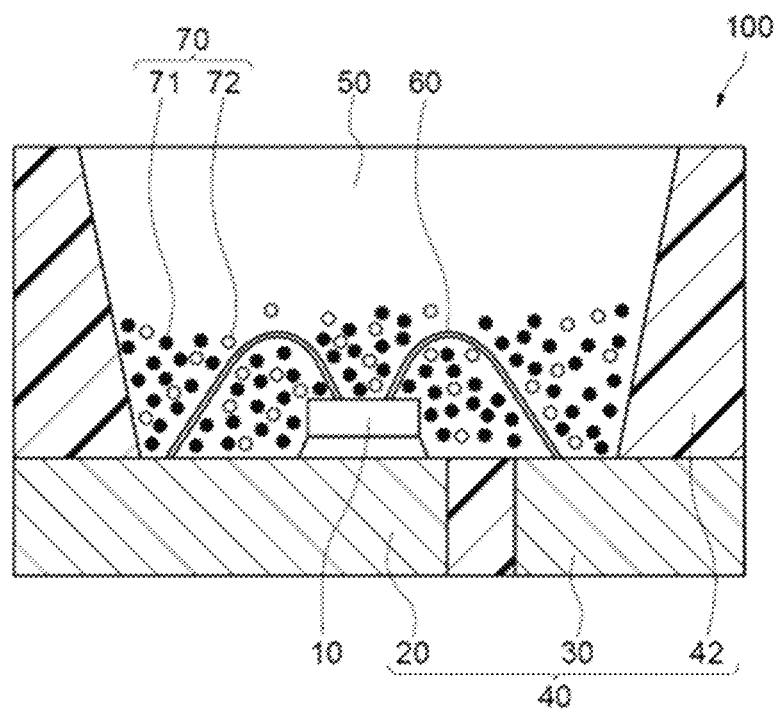
FIG. 1 is a schematic cross-sectional view showing one example of a light emitting device according to the present disclosure.

The method for producing a nitride fluorescent material, the nitride fluorescent material and the light emitting device to the present invention (hereinafter may be simply referred to as "the production method for a fluorescent material and others") are described hereinunder on the basis of embodiments. The embodiments as shown below are merely to exemplify the production method for a fluorescent material and others for the purpose of embodying the technical concept of the present invention, and the present invention is not limited to the production method for a fluorescent material and others shown below. In this description, the relationship between the color names and the chromaticity coordinates, the relationship between the wavelength range of light and the color names of monochromic light are in accordance with JIS Z8110.

Method for Producing Nitride Fluorescent Material

The first embodiment of the present disclosure is a method for producing a nitride fluorescent material that contains, as a fluorescent material core, a calcined body having a composition containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N, and the method includes preparing a calcined body having the above-mentioned composition, bringing the calcined body into contact with a fluorine-containing substance, and subjecting the calcined body to a first heat treatment at a temperature in a range of 100° C. or higher and 500° C. or lower to form a fluoride-containing first film on the calcined body, and forming, on the calcined body, a second film that contains a metal oxide containing at least one metal element M2 selected from the group consisting of Si, Al, Ti, Zr, Sn and Zn and subjecting the calcined body to a second heat treatment at a temperature in a range of higher than 250° C. and 500° C. or lower.

Preparation of Calcined Body

The calcined body to be the fluorescent material core may be any one, not specifically limited, having a composition containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N.

Preferably, the fluorescent material core has a composition represented by the following formula (I):

$$M^a{}_vM^b{}_wM^c{}_xAl_{3-y}Si_yN_z \quad (I)$$

wherein $M^a$ represents at least one element selected from the group consisting of Sr, Ca, Ba and Mg, $M^b$ represents at least one element selected from the group consisting of Li, Na and K, $M^c$ represents at least one element selected from the group consisting of Eu, Ce, Tb and Mn, v, w, x, y and z each independently represent a number satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$.

Preferably, from the viewpoint of attaining a high light emission intensity, the element $M^a$ in the formula (I) for the fluorescent material core contains at least one of Sr and Ca. In the case where the element $M^a$ contains at least one of Sr and Ca, the total molar ratio of Sr and Ca contained in the element $M^a$ is, for example, 85 mol % or more, and preferably 90 mol % or more.

Preferably, from the viewpoint of stability of crystal structures, the element $M^b$ in the formula (I) contains at least Li. In the case where the element $M^b$ in the formula (I) contains Li, the molar ratio of Li contained in $M^b$ is, for example, 80% by mol or more, and preferably 90% by mol or more.

Regarding the values of parameters v, w and x in the formula (I), the parameter v is, from the viewpoint of the stability of crystal structures, preferably 0.80 or more and 1.05 or less, more preferably 0.90 or more and 1.03 or less. The parameter w is, from the viewpoint of stability of crystal structures, preferably 0.80 or more and 1.05 or less, more preferably 0.90 or more and 1.03 or less. The parameter x is an activation amount of at least one element selected from the group consisting of Eu, Ce, Tb and Mn, and may be appropriately selected so as to attain the desired characteristics. More preferably, the parameter x is a number satisfying $0.001 < x \leq 0.020$ and is even more preferably a number satisfying $0.002 \leq x \leq 0.015$.

The calcined body to be the fluorescent material core may be produced by mixing raw materials so that the composition may contain the element $M^a$, the element $M^b$, the element $M^c$ and Al, and optionally Si and N, and then calcining the resultant raw material mixture in an atmosphere containing nitrogen gas, for example, at a temperature of 1000° C. or higher and 1300° C. or lower under a pressure of 0.2 MPa or more and 200 MPa or less. For the method of producing the calcined body to be the fluorescent material core, for example, the method described in Japanese Patent Application No. 2016-193960 may be referred to.

The raw material mixture for use for the calcined body to be the fluorescent material core is not specifically limited in point of the materials contained in the raw material mixture so far as the mixture gives the above-mentioned calcined body. For example, the raw material mixture may contain at least one selected from the group consisting of simple substances of metal elements and metal compounds thereof to constitute the above-mentioned composition.

Specifically, an $M^a$ compound containing the element $M^a$ includes $SrN_2$, SrN, $Sr_3N_2$, $SrH_2$, $SrF_2$, $Ca_3N_2$, $CaH_2$, $CaF_2$, $Ba_3N_2$, $BaH_2$, $BaF_2$, $Mg_3N_2$, $MgH_2$, and $MgF_2$, and at least one selected from the group of these is preferred. In the case where $SrF_2$ is used as a raw material, it may function not only as the $M^a$ compound but also as a flux. As the $M^a$ compound, compounds such as imide compounds, amide compounds may also be used.

An $M^b$ compound containing the element $M^b$ preferably contains at least Li, and is more preferably at least one of Li nitrides and hydrides. In the case where the second compound contains Li, a part of Li may be substituted with Na and/or K, and may contain any other metal element constituting the nitride fluorescent material. Specifically, the $M^b$ compound containing Li includes $Li_3N$, $LiN_3$, $LiH$, and $LiAlH_4$.

An Al compound containing Al may be a compound containing substantially Al alone as the metal element, or may be a compound where a part of Al is substituted with an element selected from the Group 13 elements Ga and In, and transition metals of the 4th Period V, Cr, Co and others, or may be a metal compound containing any other element than Al to constitute the nitride fluorescent material, such as Li, in addition to Al. Specifically, the Al compound includes AlN, $AlH_3$, $AlF_3$, and $LiAlH_4$, and is preferably at least one selected from the group of these.

In the case where a part of Al in the composition of the calcined body contains Si, an Si-containing compound may be used in the raw material mixture. As the Si-containing compound, at least one selected from the group consisting of $SiO_2$, $Si_3N_4$, SiC, and $SiCl_4$ may be used.

An $M^c$ compound containing the element $M^c$ contains Eu, Ce, Tb or Mn as an activator. In the case where the element $M^c$ is Eu, a part of Eu contained in the $M^c$ compound may be substituted with Sc, Y, La, Ce, Pr, Nd, Sm, Gd, Tb, Dy, Ho, Er, Tm, Yb, or Lu. It is considered that when a part of Eu is substituted with any other element, the other element may act, for example, as a coactivator. By coactivating the nitride fluorescent material with two or more kinds of activating elements, the light emission characteristics of the material can be controlled.

In the case where the element $M^c$ is Eu, specifically, the $M^c$ compound includes $Eu_2O_3$, EuN, and $EuF_3$, and at least one selected from the group of these is preferably used.

The raw material mixture may contain a flux. When the raw material mixture contains a flux, the reaction between raw materials can be promoted and further solid-phase reaction can run on more uniformly, and therefore a calcined body for giving a nitride fluorescent material having a large particle size and having more excellent light emission characteristics can be produced.

Raw materials are, for example, after each weighed in a glove box in an inert atmosphere, mixed to give a raw material mixture.

The raw material mixture is calcined in a nitrogen atmosphere. For calcining, for example, a gas-pressurized electric furnace may be used. The calcining temperature is preferably within a range of 1000° C. or higher and 1400° C. or lower. The calcining temperature is more preferably 1000° C. or higher and 1300° C. or lower, even more preferably 1100° C. or higher and 1300° C. or lower. When the calcining temperature is low, the intended fluorescent compound could hardly be formed, but when the calcining temperature is high, the fluorescent material compound may decompose to detract from the light emission characteristics thereof. The calcining may be carried out in two-stage calcining (multistage calcining) in such a manner that the first-stage calcining is carried out at 800° C. or higher and 1000° C. or lower, then the system is gradually heated, and the second-stage calcining is carried out at 1000° C. or higher and 1400° C. or lower.

Preferably, the calcining atmosphere is a nitrogen gas-containing atmosphere, and may be an atmosphere containing at least one selected from the group consisting of hydrogen, argon, carbon dioxide, carbon monoxide, ammonia in addition to nitrogen gas. Preferably, the ratio of the nitrogen gas in the calcining atmosphere is 70% by volume or more, more preferably 80% by volume or more.

Preferably, the calcining is carried out in a pressurized atmosphere at 0.2 MPa or more and 200 MPa or less. The calcined body having the intended composition may readily decompose at a higher temperature, but in a pressurized atmosphere, the decomposition may be suppressed to attain more excellent light emission characteristics. The gauge pressure in the pressurized atmosphere is more preferably 0.2 MPa or more and 1.0 MPa or less, even more preferably 0.8 MPa or more and 1.0 MPa or less. By increasing the atmosphere gas pressure in calcining, the decomposition during calcining can be suppressed and a calcined body having the intended composition is easy to produce.

The calcining time may be appropriately selected depending on the calcining temperature, the gas pressure, etc. The calcining time is, for example in range of 0.5 hours or more and 20 hours or less, and is preferably in a range of 1 hour or more and 10 hours or less.

By calcining, a calcined body having the intended composition can be obtained.

Formation of First Film

The production method for a nitride fluorescent material of the embodiment of the present disclosure includes bringing the calcined body to be a fluorescent material core into contact with a fluorine-containing substance and subjecting it to a first heat treatment at a temperature in a range of 100° C. or higher and 500° C. or lower to form a fluoride-containing first film on the calcined body. For the method for forming the first film on the calcined body to be a fluorescent material core, for example, the method described in Japanese Patent Application No. 2016-193960 may be referred to.

Through the process of bringing the calcined body into contact with a fluorine-containing substance followed by first heat treatment in a range of 100° C. or higher and 500° C. or lower, a fluoride-containing first film is formed on the calcined body.

Fluorine-Containing Substance

The fluorine-containing substance includes a fluorine gas ($F_2$) and a fluorine compound. The fluorine compound is preferably at least one selected from the group consisting of $CHF_3$, $CF_4$, $NH_4HF_2$, $NH_4F$, $SiF_4$, $KrF_2$, $XeF_2$, $XeF_4$ and $NF_3$. The fluorine-containing substance is more preferably a fluorine gas ($F_2$) or an ammonium fluoride ($NH_4F$). The temperature in the environment where the calcined body is brought into contact with the fluorine-containing substance may be room temperature (20° C.±5° C.) to a temperature lower than the first heat treatment temperature, or may be the first heat treatment temperature.

In the case where the fluorine-containing substance is in a solid state or a liquid state at room temperature, preferably, the fluorine-containing substance is brought into contact with the calcined body in an amount in a range of 1% by mass or more and 10% by mass or less relative to 100% by mass of the total amount of the calcined body and the fluorine-containing substance, more preferably in a range of 2% by mass or more and 8% by mass or less, even more preferably in a range of 3% by mass or more and 7% by mass or less. Accordingly, it is presumed that a layer of a fluorine-containing compound may be readily formed on the surface or in the vicinity of the surface of the calcined body.

In the case where the fluorine-containing substance is gaseous, the calcined body may be arranged in an atmosphere containing the fluorine-containing substance for contact therebetween, or the first heat treatment may be carried out in an atmosphere containing a fluorine-containing substance. The $F_2$ concentration in the atmosphere is preferably in a range of 2% by volume or more and 25% by volume or less, more preferably in a range of 5% by volume or more and 20% by volume or less. When the $F_2$ concentration in the atmosphere is lower than a predetermined level, desired durability could not be attained. On the other hand, when the $F_2$ concentration is higher than a predetermined level, even the base body of the fluorescent material would be fluorinated to significantly lower the light emission intensity of the fluorescent material.

First Heat Treatment

The calcined body is brought into contact with a fluorine-containing substance and then subjected to first heat treatment in a range of 100° C. or higher and 500° C. or lower. Through the first heat treatment, a fluoride-containing first film is formed on the calcined body.

Preferably, the first heat treatment is carried out in an inert gas atmosphere. In this description, an inert gas atmosphere means an atmosphere that contains argon, helium, nitrogen as the main component therein and has a concentration of oxygen contained therein of 15% by volume or less. The inert gas atmosphere may contain oxygen as an unavoidable impurity. The concentration of oxygen in the inert gas atmosphere is preferably 10% by volume or less, more preferably 5% by volume or less, even more preferably 1% by volume or less. This is because, when the oxygen concentration is higher than a predetermined level, the particles of the fluorescent material would be too much oxidized. In consideration of safety, the first heat treatment is preferably carried out in an atmosphere containing an inert gas and a fluorine-containing substance.

The first heat treatment temperature is in a range of 100° C. or higher and 500° C. or lower, preferably in a range of 120° C. or higher and 450° C. or lower, more preferably in a range of 150° C. or higher and 400° C. or lower, even more preferably in a range of 150° C. or higher and 350° C. or lower.

When the first heat treatment temperature is lower than a predetermined temperature, a fluoride-containing first film could hardly formed on the calcined body. On the other hand, when the first heat treatment temperature is higher than a predetermined temperature, the crystal structure of the calcined body would be readily broken.

Though not specifically limited, the first heat treatment time is preferably in a range of 1 hour or more and 10 hours or less, more preferably in a range of 2 hours or more and 8 hours or less. When the first heat treatment time is in a range of 1 hour or more and 10 hours or less, a fluoride-containing first film may be formed on the surface or in the vicinity of the surface of the calcined body through the first heat treatment in contact between the calcined body and a fluorine-containing substance.

After the first heat treatment, post heat treatment may be carried out at a temperature higher than in the first heat treatment. The post heat treatment temperature is preferably higher than that in the first heat treatment, and is preferably in a range of 200° C. or higher and 500° C. or lower, more preferably in a range of 250° C. or higher and 450° C. or lower, even more preferably in a range of 300° C. or higher and 400° C. or lower. By carrying out the post heat treatment after the first heat treatment, a fluoride-containing, tough first film that secures high bonding to the surface of the calcined body can be formed.

Though not specifically limited, the post heat treatment time is preferably in a range of 1 hour or more and 15 hours or less, more preferably in a range of 2 hours or more and 12 hours or less, even more preferably in a range of 3 hours or more and 10 hours or less. Preferably, the post heat treatment is carried out in air or in an inert gas atmosphere.

After the first heat treatment, a fluoride-containing first film that contains at least one element constituting the calcined body to be the fluorescent material core is formed on the surface of the calcined body. Preferably, the first film has a first layer and a second layer in that order from the side of the fluorescent material core. Preferably, the first layer contains a fluoride that differs from the composition of the second layer. When the first film has the first layer and the second layer, it functions as a double-layer protective film to protect the fluorescent material core to thereby prevent the core from being degraded by external environments. In the case where the nitride fluorescent material, in which the first layer and the second layer of the first film function as a double-layer protective film for the fluorescent material core, is used in a light emitting device, the durability of the light emitting device can be thereby improved. Preferably, the first layer and the second layer each contain a fluoride having a composition that contains the element $M^a$, fluorine and Al. Preferably, the fluoride contained in the first layer has a composition having a larger molar ratio of Al relative to the element $M^a$ than in the fluoride contained in the second layer. When the fluoride contained in the first layer has a composition having a larger molar ratio of Al relative to the element $M^a$ than in the fluoride contained in the second layer, it is presumed that the fluorescent material core and the first layer may strongly bond to each other.

Preferably, the first heat treatment is carried out before the formation of the second film to be mentioned hereinunder. The nitride fluorescent material may be readily influenced by oxygen, heat and moisture, depending on the crystal structure of the fluorescent material core, and therefore preferably, the first film is formed by the first heat treatment and then, while the calcined body is protected with the first film, the second film is formed, and further the second heat treatment is carried out.

The first heat treatment may also be carried out after the second heat treatment to be mentioned hereinunder. In the case where the first heat treatment is carried out through contact between the calcined body and a fluoride-containing substance after the second heat treatment, as the case may be, a fluoride-containing film that contains at least one metal element M2 selected from the group consisting of Si, Al, Ti, Zr, Sn and Zn, and fluorine may be formed.

Formation of Second Film

The production method for a nitride fluorescent material of the embodiment of the present disclosure includes forming a second film containing a metal oxide that contains the above-mentioned element M2, on the calcined body, and subjecting it to a second heat treatment at a temperature in a range of higher than 250° C. and 500° C. or lower.

As one example of the second film formation method, preferably, the calcined body is brought into contact with a solution containing a metal alkoxide, and through hydrolysis of the metal alkoxide and polycondensation, a second film containing a metal oxide is formed. More preferably, the calcined body having the first film is brought into contact with a metal alkoxide-containing solution, and through hydrolysis of the metal alkoxide and polycondensation, a second film containing a metal oxide is formed. Preferably, the second film is formed in a sol-gel process using a metal alkoxide. The metal alkoxide preferably contains at least one metal element M2 selected from Si, Al, Ti, Zr, Sn and Zn.

Preferably, the metal alkoxide is a silane compound having 2 or more alkoxyl groups, and specifically includes methyltrimethoxysilane, methyltriethoxysilane, ethyltrimethoxysilane, ethyltriethoxysilane, propyltrimethoxysilane, propyltriethoxysilane, tetramethoxysilane, tetraethoxysilane, tetrapropoxysilane, titanium tetrapropoxide, titanium tetrabutoxide, aluminum triethoxide, aluminum tripropoxide, aluminum tributoxide, zirconium tetrapropoxide, zirconium tetrabutoxide, tin tetrabutoxide, zinc tetrapropoxide, and zinc tetrabutoxide. In consideration of workability and easy availability, the metal alkoxide is preferably tetraethoxysilane.

In consideration of operability, preferably, the metal alkoxide-containing solution contains an organic solvent.

The organic solvent contained in the metal alkoxide-containing solution is preferably a polar organic solvent, and examples thereof include ethyl acetate, tetrahydrofuran, N,N-diethylformamide, dimethyl sulfoxide, alcohols having a linear or branched alkyl group with 1 to 8 carbon atoms; carboxylic acids such as formic acid, acetic acid, etc.; ketones such as acetone, etc. The polar organic solvent is preferably a lower alcohol having a linear or branched alkyl group with 1 to 3 carbon atoms, or a ketone. More preferably, the polar organic solvent is ethanol or ketone having a relative permittivity of 18 to 33. Specifically, more preferably, the solvent is at least one selected from the group consisting of methanol (relative permittivity 33), ethanol (relative permittivity 24), 1-propanol (relative permittivity 20), 2-propanol (relative permittivity 18) and acetone (relative permittivity 21).

When the metal alkoxide-containing solution contains an acid or alkali catalyst, the hydrolysis speed of the metal alkoxide may be thereby accelerated. Examples of the acid or alkali solution to be the catalyst include a hydrochloric acid solution and an ammonia solution.

The calcined body is brought into contact with the above-mentioned metal alkoxide-containing solution for hydrolysis of the metal alkoxide followed by polycondensation thereby forming a second film containing an oxide of the metal element M2 as the main component. For example, in the case where the metal alkoxide is tetraethoxysilane ($Si(OC_2H_5)_4$), the calcined body is brought into contact with a solution containing tetraethoxysilane ($Si(OC_2H_5)_4$) and the tetraethoxysilane is hydrolyzed to form orthosilicic acid ($Si(OH)_4$), and then dehydration reaction runs on though polycondensation of orthosilicic acid ($Si(OH)_4$) to form a second film containing silica ($SiO_2$) as the main component. The second film contains silica ($SiO_2$) formed through the above-mentioned polycondensation, and the second film may contain a silicon compound where a hydroxyl group (OH) may partly remain therein.

In the case where the second film is formed on the calcined body, preferably, the second film is formed on the calcined body having the first film. The calcined body to be a fluorescent material core is readily influenced by oxygen, heat and moisture owing to the crystal structure. Therefore, in the case where the second film is formed on the calcined body having the first film according to a sol-gel process, preferably, the first film has been formed on the surface of the calcined body through the first heat treatment and then the second film is formed thereon according to a sol-gel process.

Second Heat Treatment

The calcined body on which the second film containing a metal oxide has been formed is subjected to second heat treatment in a temperature range of higher than 250° C. and 500° C. or lower. Through the second heat treatment, dehydration runs on in the second film containing a hydroxyl group (OH) to give a tough film. In the case where the second film containing a metal oxide is formed on the calcined body having the fluoride-containing first film, oxygen contained in the metal oxide in the second film acts on the first film therefore resulting in that the metal element M2 is also contained in the first film. In the nitride fluorescent material obtained after the second heat treatment, the amount of the metal element M2 contained in the second film is larger than that of the metal element M2 contained in the first film. Since the metal element M2 is contained also in the first film, it is presumed that the fluoride contained in the first film may react with the metal oxide contained in the second film through the second heat treatment whereby dehydration may run on in the second film containing a hydroxyl group (OH), and as a result, a part of the metal element M2 contained in the second film may bond with the element (for example, Sr or Al) in the fluoride in the first film via oxygen so that the metal element M2 may also be contained in the first film. In the nitride fluorescent material obtained according to the production method of the embodiment of the present disclosure, the first film and the second film function as a double-layer protective film to prevent the nitride fluorescent material from degrading in external environments, thereby further improving the durability of a light emitting device containing the nitride fluorescent material.

When the second film containing a metal oxide is formed on the first film-having calcined body and then subjected to second heat treatment, as the case may be, oxygen contained in the metal oxide in the second film may act also on the first film and fluorine may be contained also in the second film. Preferably, in the nitride fluorescent material obtained after the second heat treatment, the amount of fluorine contained in the first film is larger than the amount of fluorine contained in the second film.

When the first film has a first layer and a second layer, and when a metal oxide-containing second film is formed on the first film-carrying calcined body and then subjected to second heat treatment, the first layer of the first film arranged on the side of the calcined body to be the fluorescent material core comes to have a composition containing the element $M^a$, fluorine, Al and oxygen, the second layer of the first film arranged on the side of the second film comes to have a composition containing fluorine, the element $M^a$, Al, the metal element M2 and oxygen in an amount larger than that in the first layer. It is presumed that the second layer arranged on the side of the second film may react with the metal oxide contained in the second film, and the element (for example, the element $M^a$ or Al) contained in the second layer of the first film, and the metal element M2 contained in the second film may bond to each other via oxygen to form a stable structure, and therefore it is considered that the function to protect the fluorescent material core may be thereby improved.

Figure 4:
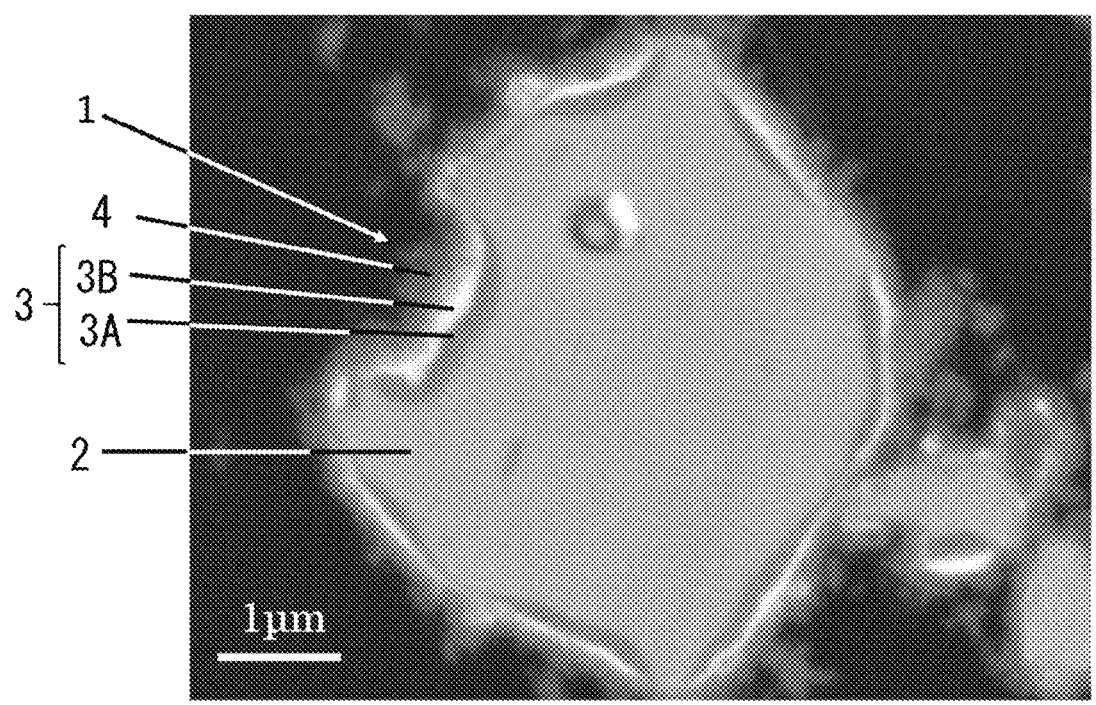
FIG. 4 is a SEM micrograph of a reflected electron image of a cross section of a nitride fluorescent material of Example 2 in the present disclosure.

As shown in the SEM micrograph of a reflected electron image of a cross section of a nitride fluorescent material in FIG. 4 to be mentioned hereinunder, by forming a second film after the first treatment followed by the second heat treatment, a nitride fluorescent material is obtained in which three layers of the first layer of the first film, the second layer of the first film and the second film are formed on the surface of the fluorescent material core. When the nitride fluorescent material has the first film having a double-layer structure and the second film, the film of these three layers functions as a protective film to prevent the nitride fluorescent material from degrading in external environments, and therefore the durability of the light emitting device using the nitride fluorescent material can be thereby improved.

The nitride fluorescent material is readily influenced by external environments, and therefore, for example, when the second film is formed according to a sol-gel process, preferably, after the first film has been formed on the surface of the fluorescent material core through the first heat treatment, the second film is formed, and thereafter the second heat treatment is carried out.

In the case where the second film is formed after the first heat treatment and thereafter the second heat treatment is carried out, the second film can be formed while the calcined body is protected with the fluoride-containing first film, and thereafter the second heat treatment is further carried out. Accordingly, the calcined body can be prevented from degrading in the production process.

The second heat treatment temperature is in a range of higher than 250° C. and 500° C. or lower, preferably in a range of higher than 250° C. and 450° C. or lower, more preferably in a range of 300° C. or higher and 400° C. or lower.

When the second heat treatment temperature is 250° C. or lower, oxygen in the metal oxide contained in the second film could hardly act on the first film since the temperature is low, and if so, the metal oxide contained in the second film could hardly bond to the element contained in the first film via oxygen and the function of the protective film may lower. On the other hand, when the second heat treatment temperature is higher than 500° C., the crystal structure of the calcined body would be readily broken.

Preferably, the second heat treatment is carried out in air or in an inert gas atmosphere.

Though not specifically limited, the second heat treatment time is preferably in a range of 1 hour or more and 20 hours or less, more preferably in a range of 2 hours or more and 15 hours or less, even more preferably in a range of 3 hours or more and 10 hours or less. When the second heat treatment time is in a range of 1 hour or more and 20 hours or less, the heat treatment would not have an influence on the structure of the fluorescent material core and a second film containing a metal oxide and having a small amount of a hydroxyl group (OH) therein may be formed.

The second heat treatment may be carried out before the first heat treatment.

In the case where a metal oxide-containing second film is formed and the second heat treatment is carried out before the first heat treatment, it is presumed that a compound containing at least a metal element M2 and fluorine may be formed in the second film though the first heat treatment of bringing the calcined body into contact with a fluorine-containing substance.

Post-Treatment

The production method for a nitride fluorescent material of the embodiment of the present disclosure may include a post-treatment of crushing treatment, grinding treatment, classification treatment for the resultant nitride fluorescent material after the first heat treatment and the second heat treatment.

Nitride Fluorescent Material

The nitride fluorescent material of one aspect of the present invention has, on the surface of a fluorescent material core containing at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N, a first film containing a fluoride, and a second film containing a metal oxide that contains at least one metal element M2 selected from the group consisting of Si, Al, Ti, Zr, Sn and Zn, wherein the first film contains the metal element M2 and the amount of the metal element M2 contained in the second film is larger than the content of the metal element M2 contained in the first film.

The nitride fluorescent material is preferably one produced according to the production method of the embodiment of the present disclosure.

Fluorescent Material Core

Preferably, the fluorescent material core in the nitride fluorescent material has a composition represented by the following formula (I):

$$M^a{}_v M^b{}_w M^c{}_x Al_{3-y} Si_y N_z \qquad (I)$$

wherein $M^a$ represents at least one element selected from the group consisting of Sr, Ca, Ba and Mg, $M^b$ represents at least one element selected from the group consisting of Li, Na and K, $M^c$ represents at least one element selected from the group consisting of Eu, Ce, Tb and Mn, v, w, x, y and z each independently represent a number satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$.

Preferably, from the viewpoint of attaining a high light emission intensity, the element $M^a$ in the formula (I) contains at least one of Sr and Ca. In the case where the element $M^a$ contains at least one of Sr and Ca, the total molar ratio of Sr and Ca contained in the element $M^a$ is, for example, 85% by mol or more, and preferably 90% by mole Preferably, from the viewpoint of stability of crystal structures, the element $M^b$ in the formula (I) contains at least Li. In the case where the element $M^b$ contains Li, the molar ratio of Li contained in $M^b$ is, for example, 80% by mol or more, and preferably 90% by mol.

The values of parameters v, w and x in the formula (I) are not specifically limited so far as they each satisfy the above-mentioned numerical value range. From the viewpoint of the stability of crystal structures, the parameter v is preferably in a range of 0.80 or more and 1.05 or less, more preferably in a range of 0.90 or more and 1.03 or less. The parameter w is, from the viewpoint of stability of crystal structures, preferably in a range of 0.80 or more and 1.05 or less, more preferably in a range of 0.90 or more and 1.03 or less. The parameter x is an activation amount of at least one element $M^c$ selected from the group consisting of Eu, Ce, Tb and Mn, and may be appropriately selected so as to attain the desired characteristics. Preferably, the parameter x is a number satisfying $0.001 < x \leq 0.020$ and is even more preferably a number satisfying $0.002 \leq x \leq 0.015$.

First Film

The nitride fluorescent material has a fluoride-containing first film, and the first film contains the metal element M2. Preferably, the first film has a first layer and a second layer from the side of the fluorescent material core, and the first layer contains a fluoride having a composition differing from that in the second layer. The first layer and the second layer of the first film may function as a double-layer protective film to prevent the fluorescent material core from degrading in external environments, and the durability of a light emitting device containing the nitride fluorescent material can be thereby improved.

In the first film of the nitride fluorescent material, the mechanism of forming the first layer and the second layer from the side of the fluorescent material core is not clear, but it is considered that, by bringing the calcined body into contact with a fluorine-containing substance followed by the first heat treatment in a temperature range of 100° C. or higher and 500° C. or lower, the element $M^a$ constituting the skeleton of the crystal structure of the fluorescent material core formed of the calcined body may react with fluorine to form a fluoride-containing second layer on the side of the surface of the fluorescent core. Further, it is presumed that, through the first heat treatment, and depending on the oxidation condition of the surface of the calcined body to be the fluorescent material core and on crystal structure condition of the calcined body to be the fluorescent material core, for example, the presence of lattice defects as well as the amount thereof, fluorine in the fluorine-containing substance may react inside the crystal structure of the calcined body to thereby form the first layer that contains the element $M^a$, Al, fluorine and nitrogen. Preferably, the fluoride contained in the first layer has a composition having a larger molar ratio of Al relative to the element $M^a$ than that of the fluoride contained in the second layer. It is presumed that, the fluoride contained in the first layer has a composition having a larger molar ratio of Al relative to the element $M^a$ than that of the fluoride contained in the second layer, thus, the fluorescent material core and the first layer may strongly bond to each other.

In the case where the second film is formed on the calcined body having the first film and then subjected to second heat treatment, the composition of the first layer and the second layer in the first film may change depending on the metal oxide contained in the second film. On the second layer arranged on the side of the second film in the first film, oxygen in the metal oxide contained in the second film acts so that the metal oxide contained in the second film reacts with the fluoride contained in the first film, and the second layer contains a fluoride containing fluorine, the element $M^a$ and Al, the metal element M2, and oxygen in an amount larger than that in the first layer. It is presumed that, in the fluoride contained in the second layer, the element $M^a$ or Al constituting the fluoride may bond to the metal oxide contained in the second film via oxygen to form a stable structure.

In the first film, the first layer on the side of the fluorescent material core receives less action of oxygen in the metal oxide contained in the second film than the second layer and therefore contains a fluoride containing fluorine, Al, and the element $M^a$, and oxygen in an amount smaller than that in the second layer. The first layer on the side of the fluorescent material core may contain an extremely minor amount of the metal element M2, as the case may be. It is presumed that the first layer of the first film and the second layer of the first film may contain elements, specifically the elements of the amounts shown in Table 2 given in the section of Examples as described hereinunder.

In the nitride fluorescent material, preferably, the fluorine content is more than in a range of 0.5% by mass and 4.5% by mass or less relative to 100% by mass of the nitride fluorescent material, more preferably in a range of 1.0% by mass or more and 4.0% by mass or less. When the fluorine content falls within the above-mentioned range relative to 100% by mass of the nitride fluorescent material, the fluoride-containing first film can function as a protective film for contributing toward preventing the fluorescent material core from degrading in external environments.

Second Film

The nitride fluorescent material further has, on the surface of the fluorescent material core, a second film containing a metal oxide that contains at least one metal element M2 selected from the group consisting of Si, Al, Ti, Zr, Sn and Zn. In the nitride fluorescent material, preferably, the second film contains fluorine and the amount of fluorine contained in the first film is larger than the amount of fluorine contained in the second film. The nitride fluorescent material has the fluoride-containing first film and the metal oxide-containing second film in that order from the side of the fluorescent material core. And further, the nitride fluorescent material preferably has the first layer of the first film, the second layer of the first film and the second film in that order from the side of the fluorescent material core. The nitride fluorescent material has the first film and the second film in that order from the side of the fluorescent material core therein, in which, therefore, the elements constituting the crystal structure of the fluorescent material core more hardly react with carbon dioxide or moisture even in environments at relatively high temperature and humidity. As a result, the light emitting device using the nitride fluorescent material of one embodiment of the present disclosure can be more excellent in durability even in environments at relatively high temperature and humidity. In addition, the nitride fluorescent material has the first layer of the first film, the second layer of the first film and the second film in that order from the side of the fluorescent material core, in which, therefore, the fluorescent material core is protected by the three-layer structure, and the fluorescent material core is hardly influenced and degraded by external environments. And the durability of the light emitting device using the nitride fluorescent material can be thereby improved more.

Preferably, in the nitride fluorescent material, the oxide-equivalent content of the metal element M2 is 1% by mass or more and 20% by mass or less relative to 100% by mass of the nitride fluorescent material, more preferably 2% by mass or more and 15% by mass or less even more preferably 3% by mass or more and 12% by mass or less. When the oxide-equivalent content of the metal element M2 falls within the above-mentioned range relative to 100% by mass of the nitride fluorescent material, the second film can contain a sufficient amount of the metal oxide to exhibit the function thereof for preventing carbon dioxide and moisture existing in the external environments from penetrating into the crystal structure of the fluorescent material core.

The metal element M2 contained in the metal oxide in the second film of the nitride fluorescent material is at least one element selected from the group consisting of Si, Al, Ti, Zr, Sn and Zn, more preferably at least one element selected from the group consisting of Si, Al, Ti and Zr, even more preferably at least one element selected from the group consisting of Si, Al and Ti, and especially preferably Si. When the metal element M2 contained in the metal oxide in the second film of the nitride fluorescent material is at least one element selected from the group consisting of Si, Al, Ti, Zr, Sn and Zn, the metal oxide-containing second film may be formed according to a sol-gel process using a metal alkoxide containing the metal element M2. Further, in the second heat treatment at higher than 250° C. and 500° C. or lower, dehydration may run on in the second film containing a hydroxyl group (OH), and therefore a second film containing a large amount of bonds (M2-O-M2) between the metal element M2 and oxygen can be formed. The metal oxide contained in the second film may react also with the fluoride containing fluorine, the element $M^a$ and Al, which is contained in the first film, in the second heat treatment, and the second film may contain fluorine and may further contain the element $M^a$ and Al.

Especially in the case where the metal element M2 contained in the metal oxide in the second film of the nitride fluorescent material is Si and where the second film of the nitride fluorescent material is formed, the second film containing silica ($SiO_2$) and partly containing a hydroxyl group (OH) can be formed according to a sol-gel process using a silica alkoxide. In the second film, dehydration runs on through the second heat treatment, and the film contains a large amount of silicon-oxygen bonds (Si—O—Si), and further, the second film reacts with the fluoride contained in the first film, and may therefore contain fluorine and further the element $M^a$ and Al.

Preferably, the nitride fluorescent material absorbs light in a wavelength range of 400 nm or more and 570 nm or less that is a range of UV light to short wavelength side of visible light, and emits fluorescence in a wavelength range where the light emission peak wavelength is 630 nm or more and 670 nm or less.

Regarding the light emission spectrum of the nitride fluorescent material, the light emission peak wavelength thereof falls within a range of 630 nm or more and 670 nm or less, but is preferably within a range of 640 nm or more and 660 nm or less. The full width at half maximum of the light emission spectrum is, for example, 65 nm or less and is preferably 60 nm or less. The lower limit of the full width at half maximum is, for example, 45 nm or more.

In the nitride fluorescent material, the center of light emission is a rare earth Eu, Ce or Tb, or a Group-7 Mn. However, The center of light emission of the nitride fluorescent material is not limited to Eu, Ce, Tb or Mn, and for example, in the case where Eu is contained, a part of Eu may be substituted with any other rare earth metal or alkaline earth metal for coactivation with Eu for use herein. For example, a divalent rare earth ion, $Eu^{2+}$ can exist stably and emit light when a suitable base body is selected.

The mean particle size of the nitride fluorescent material is, from the viewpoint of preventing light reflection and discoloration by the first film and the second film and of attaining a desired light emission intensity, for example, 4.0 μm or more, preferably 4.5 μm or more, and more preferably 5.0 μm or more. The mean particle size of the nitride fluorescent material is, for example, 25.0 μm or less, and preferably 22.0 μm or less. The mean particle size of the nitride fluorescent material is the mean particle size of the nitride fluorescent material having the first film and the second film.

When the mean particle size of the nitride fluorescent material is a predetermined level or more, the absorbance of excitation light by the nitride fluorescent material and the light emission intensity from the nitride fluorescent material may tend to be higher. In that manner, when the nitride fluorescent material excellent in light emission characteristics is incorporated in the light emitting device to be mentioned below, the light emission efficiency of the light emitting device can be high. In addition, when the mean particle size is a predetermined level or less, the workability in the production process for the light emitting device can be improved.

In this description, the mean particle size of the nitride fluorescent material and the mean particle size of any others are the particle size (median size) measured using a volume-average particle size, laser diffractometric particle size distribution measuring apparatus (product name: MASTER SIZER 2000, manufactured by Malvern Panalytical Ltd).

Light Emitting Device

Next, the light emitting device using the nitride fluorescent material as a constituent element of the wavelength converting member therein is described.

The light emitting device of one embodiment of the present disclosure is provided with the nitride fluorescent material of the embodiment of the present disclosure and an excitation light source.

The excitation light source for use in the light emitting device is preferably an excitation light source that emits light having a wavelength in range of 400 nm or more and 570 nm or less. When the excitation light source having the wavelength range is used, a light emitting device having a high light emission intensity of the fluorescent material can be provided. The light emitting element to be used as the excitation light source for the light emitting device preferably has a main light emission peak wavelength in a range of 420 nm or more and 500 nm or less, more preferably in a range of 420 nm or more and 460 nm or less. When the light emitting element having the peak light emission wavelength that falls within the above-mentioned range is used as the excitation light source, a light emitting device capable of emitting a mixed light of light from the light emitting element and fluorescence from the fluorescent material can be constructed.

As the light emitting element, preferably, a semiconductor light emitting element using a nitride semiconductor ($In_XA-l_YGa_{1-X-Y}N$, 0≤X, 0≤Y, X+Y≤1) is used. When the semiconductor light emitting element is used as the excitation light source for the light emitting device, a stable light emitting device having a high output linearity relative to input with high efficiency and highly resistant to mechanical shock can be obtained. The full width at half maximum of the light emission spectrum of the light emitting element is, for example, preferably 30 nm or less.

The light emitting device includes at least the nitride fluorescent material of the embodiment of the present disclosure. In the nitride fluorescent material, preferably, the fluorescent material core has a composition shown by the formula (I), and is photo-excited with light having in a wavelength range of 400 nm or more and 570 nm or less, and the light emission peak wavelength thereof falls within a wavelength range of 630 nm or more and 670 nm or less. Preferably, the light emitting device includes a first fluorescent material containing the above-mentioned nitride fluorescent material, and a second fluorescent material.

The first fluorescent material may be, for example, contained in the sealing member to cover the excitation light source to construct the light emitting device. In the light emitting device where the excitation light source is covered with the sealing member that contains the first fluorescent material, a part of light emitted from the excitation light source is absorbed by the first fluorescent material and is emitted as red light. When the excitation light source capable of emitting light in a wavelength range of 400 nm or more and 570 nm or less is used, the emitted light can be more efficiently utilized.

The content of the first fluorescent material contained in the light emitting device is not specifically limited, and may be appropriately selected in accordance with the color that are desired to be finally obtained. For example, the content of the first fluorescent material may be in a range of 1 part by mass or more and 200 parts by mass or less relative to 100 parts by mass of the resin to constitute the sealing member, and is preferably in a range of 2 parts by mass or more and 180 parts by mass or less.

The light emitting device may include a second fluorescent material that differs from the first fluorescent material in point of the light emission peak wavelength.

Examples of the second fluorescent material include fluorescent materials having a composition of any of the following formulae (IIa) to (IIi), and preferably, at least one fluorescent material having a composition represented by any one selected from the group of these formulae is contained. For example, from the viewpoint of attaining a wide color reproduction range, more preferably, at least one fluorescent material having a composition represented by the formula (IIc), (IIe) or (IIi) is contained. From the viewpoint of attaining a high color rendering property, more preferably, at least one fluorescent material having a composition represented by the formula (IIa), (IId), (IIf) or (IIg) is contained.

| | |
|---|---|
| $(Y,Gd,Tb,Lu)_3(Al,Ga)_5O_{12}$:Ce | (IIa) |
| $(Ba,Sr,Ca)_2SiO_4$:Eu | (IIb) |
| $Si_{6-p}Al_pO_pN_{8-p}$:Eu($0 < p \leq 4.2$) | (IIc) |
| $(Ca,Sr)_8MgSi_4O_{16}(Cl,F,Br)_2$:Eu | (IId) |
| $(Ba,Sr,Ca)Ga_2S_4$:Eu | (IIe) |
| $(Ba,Sr,Ca)_2Si_5N_8$:Eu | (IIf) |
| $(Sr,Ca)AlSiN_3$:Eu | (IIg) |
| $K_2(Si,Ge,Ti)F_6$:Mn | (IIh) |
| $(Ba,Sr)MgAl_{10}O_{17}$:Mn | (IIi) |

Preferably, the mean particle size of the second fluorescent material is in a range of 2 μm or more and 35 μm or less, more preferably in a range of 5 μm or more and 30 μm or less. When the mean particle size is a predetermined level or more, the light emission intensity can be enlarged. When the mean particle size is a predetermined level or less, the workability in the production process for the light emitting device can be improved.

The content of the second fluorescent material may be, for example, in a range of 1 part by mass or more and 200 parts by mass or less relative to 100 parts by mass of the resin constituting the sealing member, and is preferably in a range of 2 parts by mass or more and 180 parts by mass or less.

The content ratio of the first fluorescent material to the second fluorescent material (first fluorescent material/second florescent material) may be, for example, in a range of 0.01 or more and 5.00 or less as the ratio by mass, and is preferably in a range of 0.05 or more and 3.00 or less.

The first fluorescent material and the second florescent material (hereinafter simply referred to as "fluorescent material") may constitute the sealing member to cover the light emitting element along with a resin. The resin to constitute the sealing member includes a silicone resin, and an epoxy resin.

The total content of the fluorescent material in the sealing material to constitute the sealing member may be, for example, in a range of 5 parts by mass or more and 300 parts by mass or less relative to 100 parts by mass of the resin, and is preferably in a range of 10 parts by mass or more and 250 parts by mass or less, more preferably in a range of 15 parts by mass or more and 230 parts by mass or less, and even more preferably in a range of 15 parts by mass or more and 200 parts by mass or less. When the content of the fluorescent material in the sealing material falls within the above range, the wavelength of light emitted by the light emitting element can be efficiently converted by the fluorescent material.

The sealing member may further contain a filler, a light diffusing material in addition to the resin and the fluorescent material. For example, when a light diffusing material is contained, the directionality from the light emitting element may be relaxed and the viewing angle may be thereby enlarged. Examples of the filler include silica, titanium oxide, zinc oxide, zirconium oxide, alumina, etc. In the case where the sealing member contains a filler, the content thereof may be appropriately selected depending on the intended object, etc. The filler content may be, for example, in a range of 1% by mass or more and 20% by mass or less relative to the resin.

One example of the light emitting device of this embodiment is described with reference to the drawing. FIG. 1 is a schematic cross-sectional view showing one example of the light emitting device of this embodiment. The light emitting device is an example of a surface-mount light emitting device.

A light emitting device 100 is provided with a package having a recess part formed by lead electrodes 20 and 30 and a molded body 40, a light emitting element 10, and a sealing member 50 to cover the light emitting element 10. The light emitting element 10 is arranged inside the recess part of the package, and is electrically connected to the pair of positive and negative lead electrodes 20 and 30 provided on the molded body 40 via a conductive wire 60. The sealing member 50 is filled in the recess part to cover the light emitting element 10, and seals up the recess part of the package. The sealing member 50 contains, for example, a florescent material 70 for wave length conversion of light from the light emitting element 10, and a resin. Further, the fluorescent material 70 contains a first fluorescent material 71 and a second fluorescent material 72. A part of the pair of positive and negative lead electrodes 20 and 30 is exposed out on the outside surface of the package. Via these lead electrodes 20 and 30, the light emitting device 100 receives power from the outside to emit light.

The sealing member 50 contains the resin and the fluorescent material, and is formed to cover the light emitting element 10 arranged inside the recess part of the light emitting device 100.

EXAMPLES

Hereinunder the present invention is described more specifically with reference to examples, but the present invention is not limited to these examples.

Production of Calcined Body

A calcined body to be a fluorescent material core having a composition containing Sr, Li, Eu, Al and N was produced. Specifically, for producing a calcined body to be a fluorescent material core having a composition represented by the formula (I) $M^a{}_v M^b{}_w M^c{}_x Al_{3-y} Si_y N_z$, $SrN_u$ (corresponding to u=2/3, mixture of $Sr_2N$ and SrN), $SrF_2$, $LiAlH_4$, AlN, and $EuF_3$ were used as raw materials in such a manner that $M^a$ could be Sr, $M^b$ could be Li, and $M^c$ could be Eu. In this Example, the parameter y in the formula (I) is 0, and the fluorescent material core does not contain Si. The above-mentioned raw materials were weighed in a glove box in an inert gas atmosphere in such a manner that a molar ratio of those as a charged amount ratio could be Sr:Li:Eu:Al=0.9925:1.2000:0.0075:3.0000, and then mixed to give a raw material mixture. Here, weight ratio of $SrN_u$ to $SrF_2$ was 94:6. Since Li (lithium) readily scatters during calcining, it was blended in an amount somewhat larger than a theoretical value thereof. The raw material mixture was filled in a crucible, and heat-treated therein in a nitrogen gas atmosphere under a gas pressure of 0.92 MPa as a gauge pressure (1.02 MPa as an absolute pressure) and at a temperature of 1100° C. for 3 hours to give a calcined body to be a fluorescent material core having a composition represented by $Sr_{0.9925}Li_{1.0000}Eu_{0.0075}Al_3N_4$. Subsequently, the calcined body was dispersed and classified to give a calcined body 1.

Example 1

First Heat Treatment and Formation of First Film

The calcined body 1 was subjected to first heat treatment in an atmosphere containing a fluorine gas ($F_2$) and a nitrogen gas ($N_2$) and having a fluorine gas concentration of 20% by volume and a nitrogen gas concentration of 80% by volume, at a temperature of 150° C. for a treatment time of 8 hours, and then in air, this was subjected to post heat treatment at a temperature of 300° C. for a treatment time of 10 hours to give a fluorescent material precursor 1 formed of the calcined body 1 and a first film.

Formation of Second Film 100 g of the fluorescent material precursor 1 was put into a mother liquid prepared by mixing 180 ml of ethanol and 30 ml of aqueous ammonia containing 17.5% by mass of ammonia, and stirred, and the liquid temperature was kept at 50° C. 85 g of tetraethoxysilane ($Si(OC_2H_5)_4$) was referred to as a liquid A, and a liquid prepared by mixing 23 ml of aqueous ammonia having a concentration of 17.5% by mass and 23 ml of pure water was referred to as a liquid B. While the mother liquid was stirred, the liquid A and the liquid B were dropwise added to the mother liquid to prepare a mixed liquid, and after the dropwise addition of the liquid A and the liquid B, the mixed liquid was stirred for 30 minutes, then the stirring was stopped, a fluorescent material precursor composed of the calcined body 1, the first film and a second film was taken out of the mixed liquid, and dried at 105° C. for 3 hours to give a fluorescent material precursor 2.

Second Heat Treatment

The fluorescent material precursor 2 was subjected to second heat treatment in air at a temperature of 300° C. for a treatment time of 10 hours to give a nitride fluorescent material of Example 1. The nitride fluorescent material of Example 1 had the fluorescent material core formed of the calcined body 1, the first film containing a fluoride, and a second film containing silica ($SiO_2$).

Example 2

The fluorescent material precursor 2 was subjected to second heat treatment in air at a temperature of 350° C. for a treatment time of 10 hours to give a nitride fluorescent material of Example 2. The nitride fluorescent material of Example 2 had a fluorescent material core formed of the calcined body 1, a first film containing a fluoride, and a second film containing silica ($SiO_2$).

Comparative Example 1

As it was, the calcined body 1 was a nitride fluorescent material of Comparative Example 1.

Comparative Example 2

The fluorescent material precursor 1 on which the second film was not formed was a nitride fluorescent material of Comparative Example 2.

Comparative Example 3

The fluorescent material precursor 2 not subjected to second heat treatment was a nitride fluorescent material of Comparative Example 3.

Comparative Example 4

The fluorescent material precursor 2 was subjected to heat treatment in air at a temperature of 250° C. for a treatment time of 10 hours to give a nitride fluorescent material of Comparative Example 4. The nitride fluorescent material of Comparative Example 4 had a fluorescent material core formed of the calcined body 1, and had, on the surface of the fluorescent material core, a film partly containing a fluoride, and a second film containing silica ($SiO_2$). The nitride fluorescent material of Comparative Example 4 had, on the surface of the fluorescent material core, a part in which the fluoride-containing film could not be differentiated from the second film.

Comparative Example 5

On the calcined body 1, a second film was formed in the same manner as in Example 1 without the first heat treatment and the first film formation, thereby producing a nitride fluorescent material of Comparative Example 5.

Comparative Example 6

On the calcined body 1, a second film was formed in the same manner as in Example 1 without the first heat treatment and the first film formation, and then this was subjected to second heat treatment in air at a temperature of 350° C. for a treatment time of 10 hours, thereby producing a nitride fluorescent material of Comparative Example 6.

Evaluation of Nitride Fluorescent Material

Light Emission Characteristics

Figure 2:
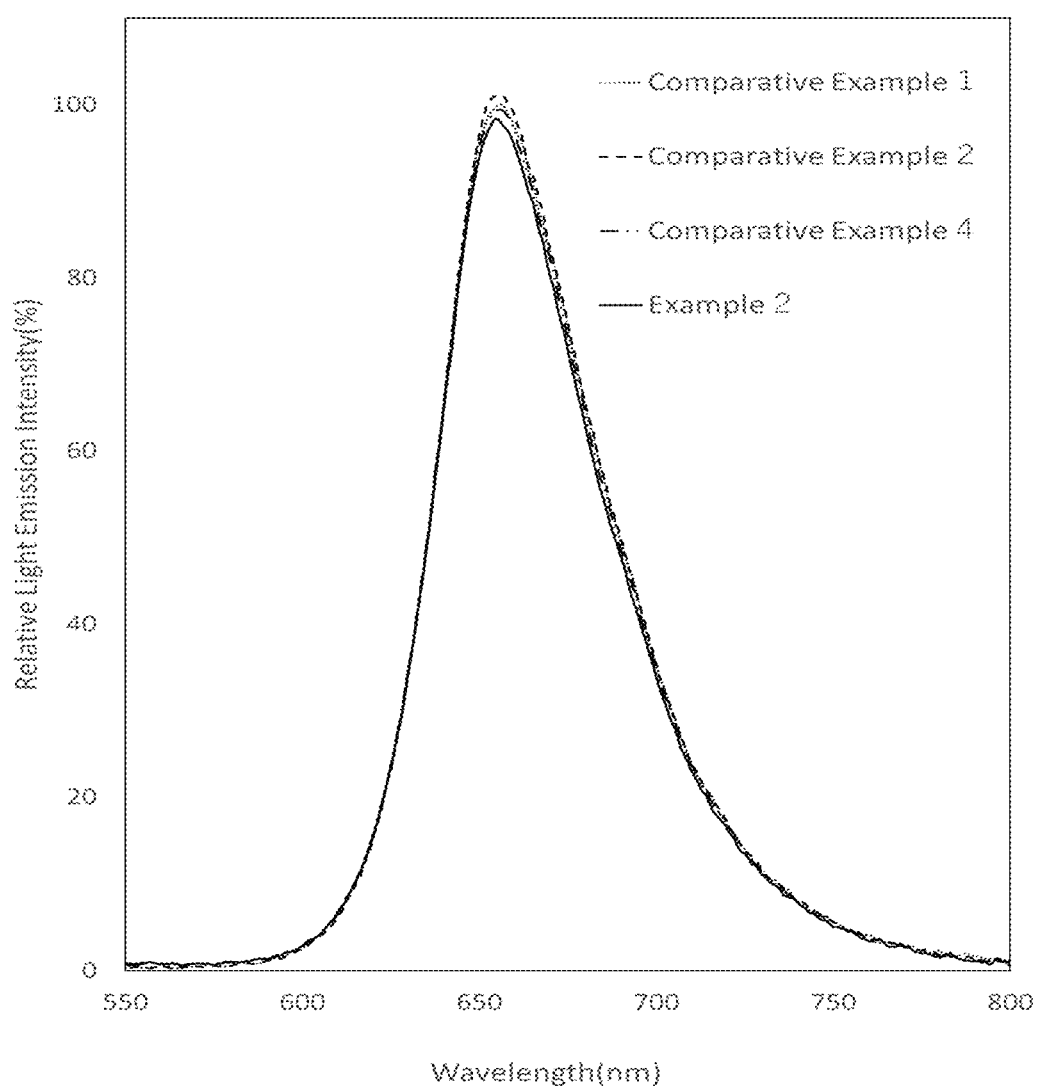
FIG. 2 is a diagram showing light emission spectra of nitride fluorescent materials of an Example and Comparative Examples in the present disclosure.

The light emission characteristics of each nitride fluorescent material were measured. The light emission characteristics of the nitride fluorescent material were measured at an excitation light wavelength of 450 nm using a spectral fluorophotometer (product name: QE-2000, manufactured by Otsuka Electronics Co., Ltd.). From the measured light emission spectrum, the relative light emission intensity (%) of each nitride fluorescent material was determined. The relative light emission intensity (%) was calculated based on the relative light emission intensity, 100% of the nitride fluorescent material of Comparative Example 1. In addition, the chromaticity (x, y) of the fluorescent material of each nitride fluorescent material was measured. The results are shown in Table 1. The light emission peak wavelength of the nitride fluorescent materials of Examples 1 and 2 and the nitride fluorescent materials of Comparative Examples 1 to 6 was all 650 nm to 660 nm. FIG. 2 shows the light emission spectra of the nitride fluorescent materials of Example 2, Comparative Example 1, Comparative Example 2 and Comparative Example 4.

Composition Analysis 1

Each nitride fluorescent material was subjected to composition analysis according to ICP emission spectrometry using an inductively coupled plasma emission spectrometer (manufactured by Perkin Elmer Corporation). Regarding silicon (Si), the data obtained through composition analysis were converted into oxide-equivalent data, and based on the nitride fluorescent material as 100% by mass, the content of silica ($SiO_2$) in the second film was calculated. Regarding fluorine, when the content thereof is less than 1.0% by mass, quantitative analysis was carried out using an ion chromatograph (ICS-1500 manufactured by DIONEX Corporation) through ion chromatography, and when the content of fluorine is 1.0% by mass or more, quantitative analysis was carried out using a double beam spectrophotometer (U-2900 manufactured by HITACHI Limited) according to a UV-VIS method. Based on the nitride fluorescent material as 100% by mass, the fluorine content and the Si oxide-equivalent content were determined. Regarding the nitride fluorescent materials of Comparative Examples 1 and 2, an Si-containing compound was not used as the raw material for the calcined body and the second film was not formed, and therefore the Si content was not determined. Regarding the nitride fluorescent materials of Comparative Examples 5 and 6, the first heat treatment was not carried out and the first film was not formed, and therefore the fluorine content was not determined. The results are shown in Table 1.

Composition Analysis 2

The nitride fluorescent material of Example 2 was buried in an epoxy resin, the resin was cured, and then this was cut so that the cross section of the nitride fluorescent material could be exposed out. The surface was polished with sandpaper, then finished with a cross section polisher (CP), and the surface was photographed with a field emission scanning electron microscope (FE-SEM, product name: JSM-7800F, manufactured by JEOL Ltd.). Thus photographed, the fluorescent material core, the first layer of the first film, the second layer of the first film and the surface part of the second film of Example 2 were subjected to composition analysis using an energy dispersive X-ray fluorescence spectrometer (EDX, product name: AZtec, manufactured by Oxford Instruments Corporation, acceleration voltage: 3 kV). The results are shown in Table 2. In Table 2, the composition of each of the first layer of the first film, the second layer of the first film and the second film was expressed as a molar ratio on the basis of strontium (Sr) (1 mol) contained in the fluorescent material core.

Mean Particle Size

Each nitride fluorescent material was analyzed using a laser diffractometric particle size distribution measuring apparatus (product name: MASTER SIZER 2000, manufactured by Malvern Panalytical Ltd), and the volume-average particle size (D50: median size) thus measured was referred to as the mean particle size.

SEM Image—Secondary Electron Image

Figure 3:
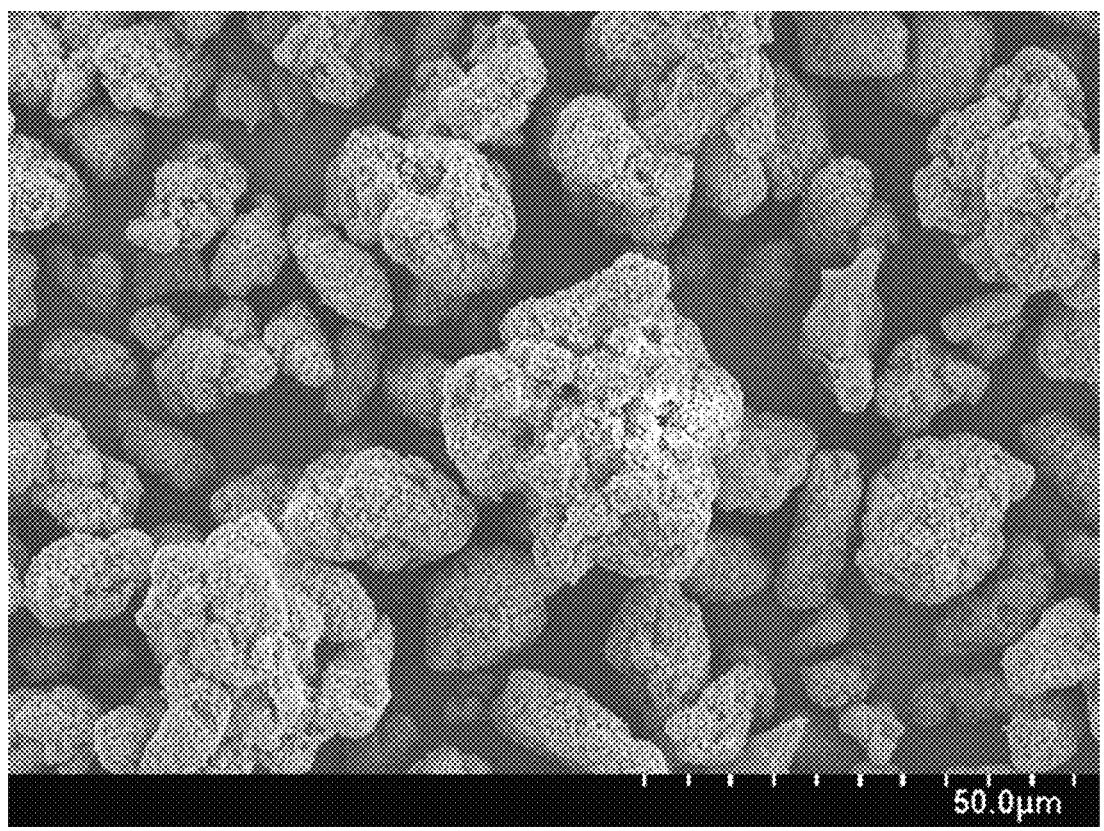
FIG. 3 is a SEM micrograph of a secondary electron image of a nitride fluorescent material of Example 1 in the present disclosure.
Figure 5:
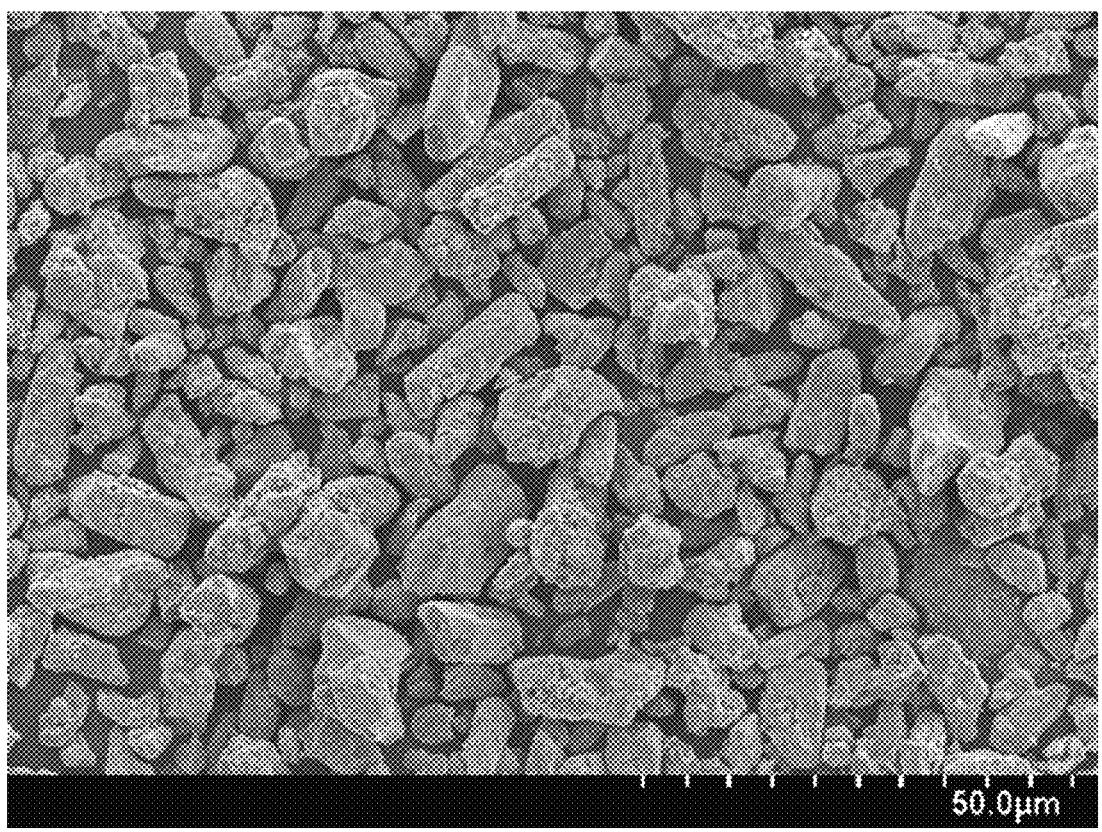
FIG. 5 is a SEM micrograph of a secondary electron image of a nitride fluorescent material of Comparative Example 1 in the present disclosure.
Figure 6:
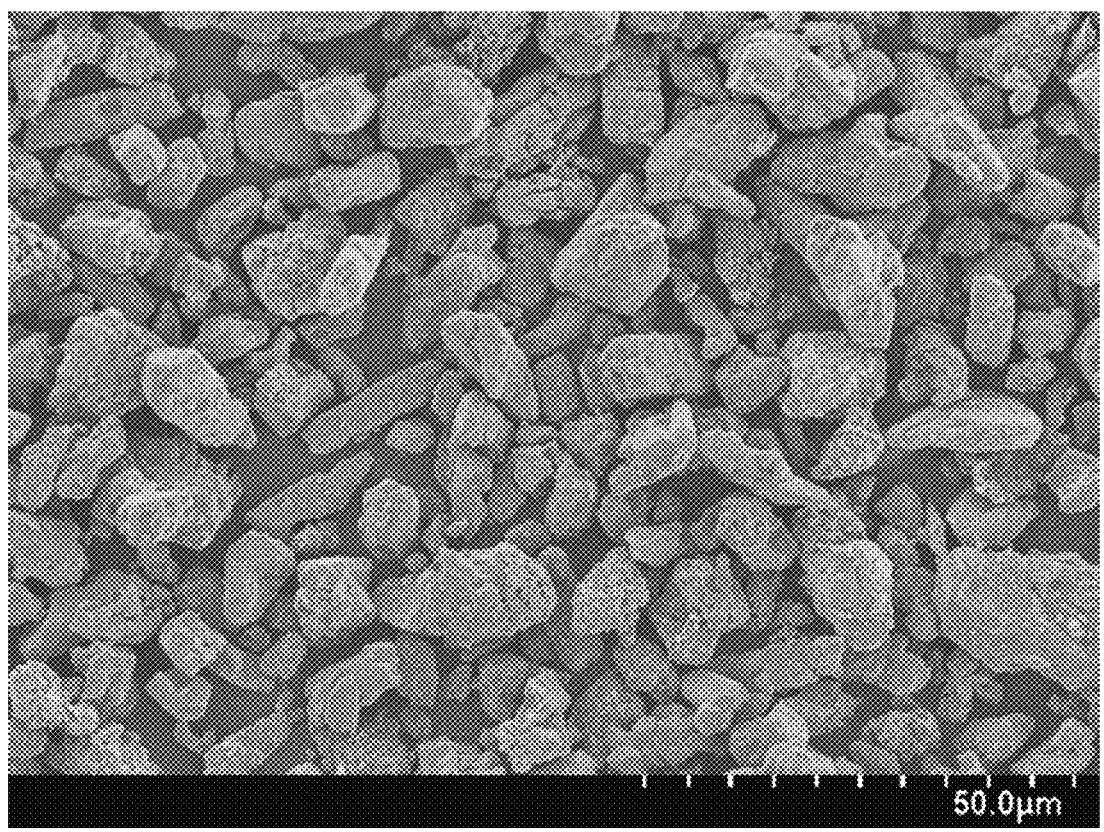
FIG. 6 is a SEM micrograph of a secondary electron image of the nitride fluorescent material of Comparative Example 2 in the present disclosure.
Figure 7:
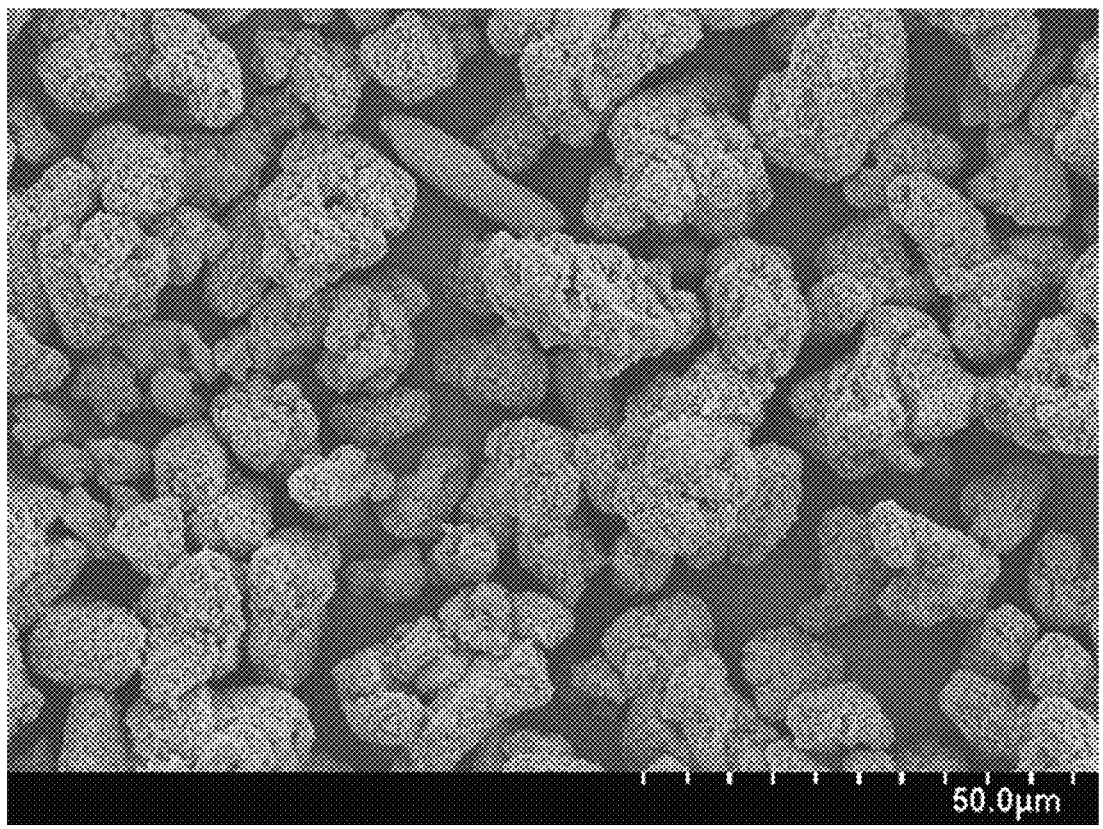
FIG. 7 is a SEM micrograph of a secondary electron image of a nitride fluorescent material of Comparative Example 3 in the present disclosure.

Using a field emission scanning electron microscope (SEM, product name: SU3500, manufactured by Hitachi High-Technologies Corporation), SEM micrographs of the nitride fluorescent materials of Comparative Examples 1 to 3 and Example 1 were taken. FIG. 3 is a SEM micrograph of the nitride fluorescent material of Example 1; FIG. 5 is a SEM micrograph of the nitride fluorescent material of Comparative Example 1; FIG. 6 is a SEM micrograph of the nitride fluorescent material of Comparative Example 2; and FIG. 7 is a SEM micrograph of the nitride fluorescent material of Comparative Example 3.

SEM Image—Reflected Electron Image

Figure 8:
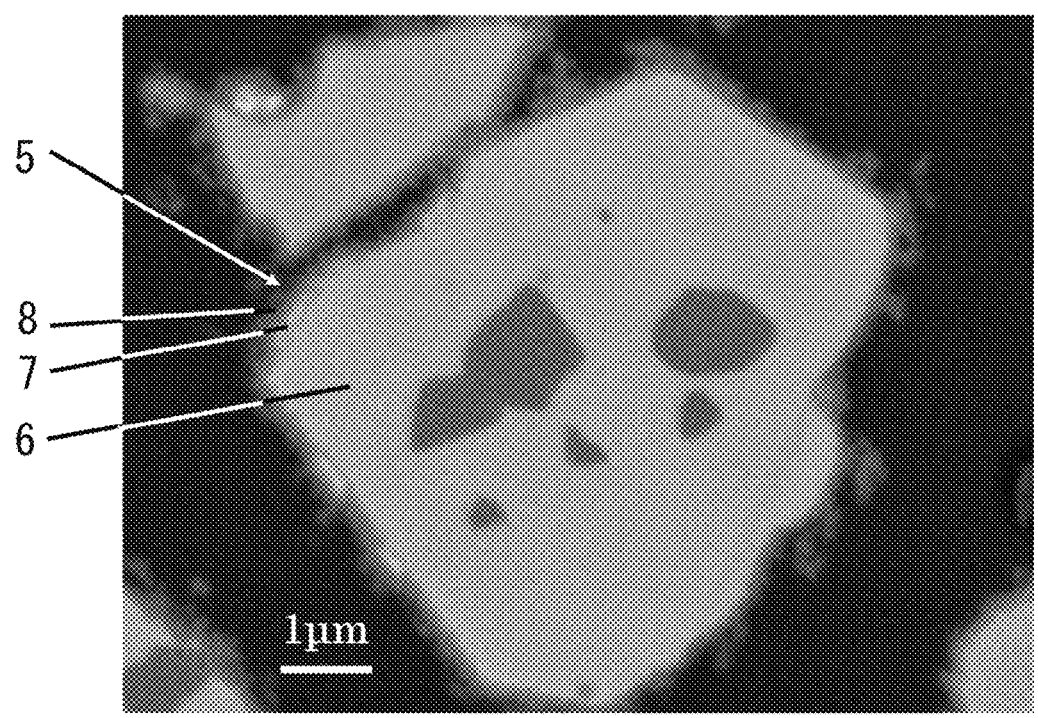
FIG. 8 is a SEM micrograph of a reflected electron image of a cross section of the nitride fluorescent material of Comparative Example 3 in the present disclosure.
Figure 9:
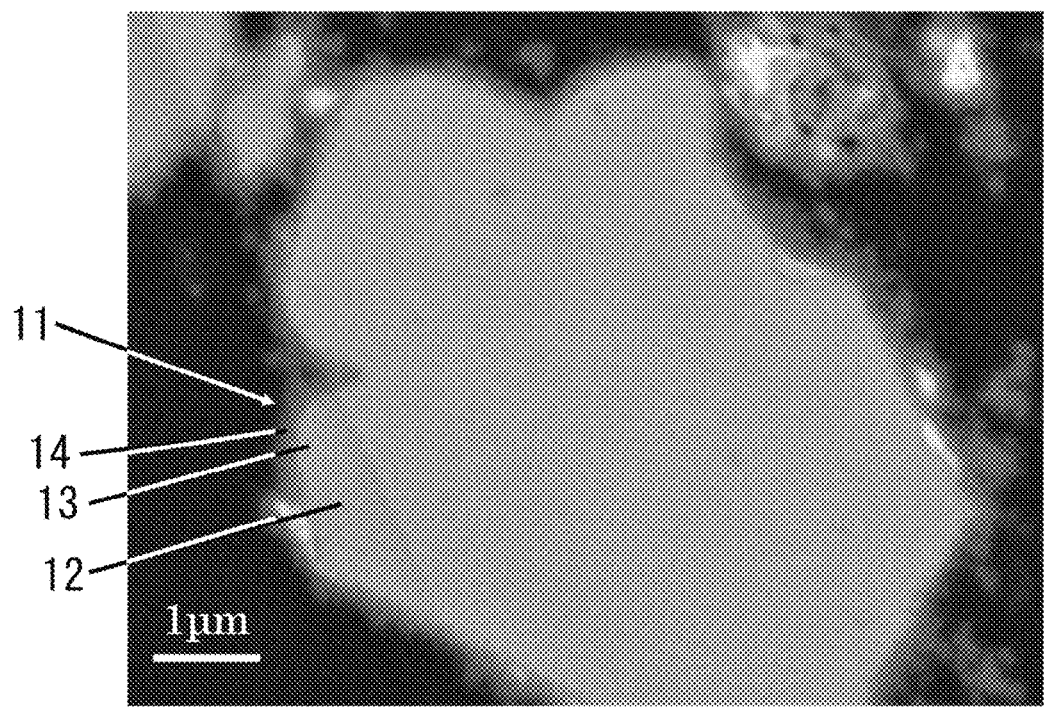
FIG. 9 is a SEM micrograph of a reflected electron image of a cross section of a nitride fluorescent material of Comparative Example 4 in the present disclosure.

The resultant nitride fluorescent material was buried in an epoxy resin, the resin was cured, and then this was cut so that the cross section of the nitride fluorescent material could be exposed out. The surface was polished with sandpaper, and then finished with a cross section polisher (CP). Using a field emission scanning electron microscope (FE-SEM, product name: JSM-7800F, manufactured by JEOL Ltd.), SEM pictures of a reflected electron image of a cross section of each nitride fluorescent material of Example 2, Comparative Example 3 and Comparative Example 4 were taken. FIG. 4 is a SEM micrograph of a reflected electron image of a cross section of the nitride fluorescent material of Example 2; FIG. 8 is a SEM micrograph of a reflected electron image of a cross section of the nitride fluorescent material of Comparative Example 3; and FIG. 9 is a SEM micrograph of a reflected electron image of a cross section of the nitride fluorescent material of Comparative Example 4.

Evaluation of Light Emitting Device

Durability Evaluation

Using each nitride fluorescent material, a light emitting device was constructed. Using each nitride fluorescent material of Examples and Comparative Examples as a first fluorescent material, and using a green fluorescent material β-sialon as a second fluorescent material, a nitride semiconductor light emitting element having a main wavelength of 451 nm was sealed up with a sealing material dispersed in a silicone resin, thereby constructing a surface-mount light emitting device having a chromaticity (x, y)=(0.25, 0.22) or so. Each light emitting device was stored in an environment tester at a temperature of 85° C. and a relative humidity of 85% for 300 hours and 500 hours to carry out a durability test. The x value on the chromaticity coordinate of the light emitting device before the durability test was referred to as an initial value, and based on this, the absolute value of the difference between the x values of the light emitting device after the durability test was referred to as Ax. The results are shown in Table 1. In the durability test of the light emitting device using the nitride fluorescent material of Comparative Examples 5 and 6, the chromaticity change after 300 hours was already larger than in Comparative Example 1, or was on the same level as in Comparative Example 1, and therefore the durability test for these nitride fluorescent materials were discontinued in 300 hours, and the durability test after 500 hours was not carried out.

TABLE 1

| | | | Nitride Fluorescent Material | | | | | Light Emitting | |
| | First Heat Treatment Condition | Second Heat Treatment Condition | Mean Particle Size D50 (μm) | Composition Analysis | | Light Emission Characteristics | | Device Durability | |
| | | | | F (% by mass) | SiO$_2$ (% by mass) | Chromaticity | | 300 hrs | 500 hrs |
| | | | | | | x | y | Relative Light Emission Intensity (%) | Δx | Δx |
|---|---|---|---|---|---|---|---|---|---|---|
| Example 1 | 150° C., 8 hrs | 300° C., 10 hrs | 20.2 | 3.8 | 11.8 | 0.692 | 0.306 | 104 | 0.0004 | 0.0020 |
| Example 2 | 150° C., 8 hrs | 350° C., 10 hrs | 20.5 | 3.9 | 12.0 | 0.693 | 0.305 | 102 | 0.0002 | 0.0004 |
| Comparative Example 1 | — | — | 10.2 | 0.5 | — | 0.700 | 0.299 | 100 | 0.0245 | 0.0245 |
| Comparative Example 2 | 150° C., 8 hrs | — | 10.5 | 4.6 | — | 0.704 | 0.296 | 97 | 0.0015 | 0.0031 |
| Comparative Example 3 | 150° C., 8 hrs | — | 20.8 | 3.9 | 11.1 | 0.704 | 0.296 | 95 | 0.0177 | 0.0195 |
| Comparative Example 4 | 150° C., 8 hrs | 250° C., 10 hrs | 20.4 | 3.9 | 12.0 | 0.693 | 0.305 | 104 | 0.0052 | 0.0107 |
| Comparative Example 5 | — | — | 21.2 | — | 12.2 | 0.704 | 0.295 | 96 | 0.0279 | — |

TABLE 1-continued

|  | Nitride Fluorescent Material | | | | | | Light Emitting Device Durability | |
|---|---|---|---|---|---|---|---|---|
| | First Heat Treatment Condition | Second Heat Treatment Condition | Mean Particle Size D50 (μm) | Composition Analysis | | Light Emission Characteristics | | |
| | | | | F (% by mass) | SiO₂ (% by mass) | Chromaticity x, y | Relative Light Emission Intensity (%) | 300 hrs Δx | 500 hrs Δx |
| Comparative Example 6 | — | 350° C., 10 hrs | 20.8 | — | 12.2 | 0.703  0.296 | 93 | 0.0218 | — |

TABLE 2

| | | Composition (molar ratio) | | | | | |
|---|---|---|---|---|---|---|---|
| | | Sr | Al | N | F | O | Si |
| Example 2 | Fluorescent Material Core | 1.0 | 2.9 | 3.2 | — | 0.2 | — |
| | First Film  First Layer | 0.6 | 2.6 | 3.4 | 1.0 | 0.7 | 0.0 |
| | First Film  Second Layer | 0.8 | 0.9 | 0.7 | 1.7 | 2.9 | 0.5 |
| | Second Film | 0.1 | 0.2 | 0.1 | 0.5 | 4.1 | 1.5 |

As shown in Table 1, the light emitting devices using the nitride fluorescent material of Examples 1 and 2 have a smaller color change (Δx) after the durability test for 300 hours or 500 hours and were excellent in durability, as compared with the light emitting devices using the nitride fluorescent material of Comparative Examples 1 to 6. The nitride fluorescent materials of Examples 1 and 2 each have a first film and a second film on the fluorescent material core, and it is considered that, owing to the double-layer protective film, the durability could be improved.

As shown in Table 2, the nitride fluorescent material of Example 2 had three layers of the first layer of the first film, the second layer of the first film and the second film from the side of the fluorescent material core. In the first film, the first layer on the fluorescent material core side contained a fluoride having a composition containing Sr, fluorine and Al, and further containing nitrogen, and further containing oxygen in an amount smaller than that in the second layer. The fluoride contained in the first layer had a composition having a larger molar ratio of Al to Sr than that of the fluoride contained in the second layer.

In the first film, the second layer arranged on the side of the second film contained Sr in an amount larger than that in the first layer, fluorine in an amount larger than that in the first layer, and Al in an amount smaller than that in the first layer, and further contained nitrogen in an amount smaller than that in the first layer and oxygen in an amount larger than that in the first layer. It is presumed that, since the amount of oxygen in the composition of the second layer arranged on the side of the second film is large, oxygen in silica (SiO₂) contained in a large amount in the second film may also act on the second layer of the first film, and the second layer contains oxygen in an amount larger than that in the first layer, and Sr and Al constituting the fluoride may bond to silica (SiO₂) in the second film via oxygen to form a stable structure, and therefore the second layer of the first film and the second film could firmly bond to each other.

As shown in Table 2, the second layer of the first film in the nitride fluorescent material of Example 2 further contained Si. The fluorine content in the first film was larger than the fluorine content in the second film, and the Si content in the first film was smaller than the Si content in the second film.

Also as shown in Table 2, the second film of the nitride fluorescent material of Example 2 contained a large amount of silica (SiO₂) and further contained fluorine, Sr and Al, and contained nitrogen (N). It is suggested that, since the second film contained oxygen in an amount of two times or more of Si therein, the compound partly containing a hydroxyl group (OH) as formed according to a sol-gel process, would undergo dehydration, and therefore a film containing a large amount of silicon-oxygen bond (Si—O—Si) would be formed. It is presumed that the silicon-oxygen bond (Si—O—Si) contained in the second film of the nitride fluorescent material of Example 2 could have reacted also with the fluoride contained in the first film and could bond to Sr or Al constituting the fluoride via oxygen, therefore forming a strong second film. The second film contained fluorine along with silica (SiO₂), the fluorine content in the second film was smaller than the fluorine content in the first film, and the Si content in the second film was larger than the Si content in the first film.

As shown in Table 1, the light emitting device using the nitride fluorescent material of Comparative Example 1 not having a first film and a second film had a significant chromaticity change after the 300-hours durability test, and it is known that the light emitting device was poor in durability.

In addition, in the light emitting device using the nitride fluorescent material of Comparative Example 2 not having a second film, the fluorescent material core was protected by the first film, and therefore even after the 300-hours or 500-hours durability test, the chromaticity did not change so much like in Comparative Example 1, but as compared with Examples 1 and 2, the chromaticity change after the durability test was great, and it is known that the light emitting device was poor in durability.

As shown in Table 1, the light emitting device using the nitride fluorescent material of Comparative Example 3 had a larger chromaticity change than the light emitting device using the nitride fluorescent material of Comparative Example 2, and the durability thereof was low. The nitride fluorescent material of Comparative Example 3 had a first film and a second film, but was not subjected to second heat treatment after the formation of the second film. Consequently, in the nitride fluorescent material of Comparative Example 3, the second film containing silica (SiO₂) through hydrolysis and polycondensation of tetraethoxysilane partly contained a silicon compound having a residual hydroxyl group (OH) therein. Consequently, it is presumed that degradation of the nitride fluorescent material having low moisture resistance would be rather promoted and the fluorescent material core could not be protected.

As shown in Table 1, the light emitting device using the nitride fluorescent material of Comparative Example 4 has a relatively small chromaticity change as compared with the light emitting devices using the nitride fluorescent material of Comparative Examples 1 and 3, but had a larger chromaticity change than the light emitting device using the nitride fluorescent material of Example 1 and the light emitting device using the nitride fluorescent material of Example 2, that is, the durability thereof was not so much improved as that of the nitride fluorescent materials of Examples 1 and 2. The nitride fluorescent material of Comparative Example 4 had a first film and a second film, and was subjected to the second heat treatment after the formation of the second film; however, it is presumed that, since the second heat treatment temperature was 250° C. and was low, a hydroxyl group (OH) would have remained in the second film and a second film containing a large amount of silicon-oxygen bond (Si—O—Si) could not be formed, and the protection of the fluorescent material core would be insufficient.

As shown in Table 1, the light emitting device using the nitride fluorescent material of Comparative Example 5 not having a first film but having a second film and not subjected to second heat treatment had a large chromaticity change than in Comparative Example 1 after the 300-hours durability test, and the durability thereof was low. The nitride fluorescent material of Comparative Example 5 did not have a first film, and after formation of the second film thereon, this was not subjected to second heat treatment, and accordingly, it is presumed that a part of the second film would have contained a hydroxyl group (OH) to thereby promote the degradation of the nitride fluorescent material having low moisture resistance.

As shown in Table 1, the light emitting device using the nitride fluorescent material of Comparative Example 6 not having a first film but having a second film and was subjected to second heat treatment has a chromaticity change on the same degree as that of Comparative Example 1 after the 300-hours durability test, and the durability thereof was low. The nitride fluorescent material of Comparative Example 6 did not have a first film but was subjected to second heat treatment after formation of the second film, however, the durability thereof could not be so much improved like in Examples 1 and 2.

As shown in FIG. 2, the shape of the light emission spectra of the nitride fluorescent materials of Example 2, Comparative Example 1, Comparative Example 2 and Comparative Example 4 differs little, and it is presumed that the first heat treatment and the second heat treatment would not change the crystal structure of the fluorescent material core, that is, the crystal structure could be maintained as such after the treatment.

The SEM micrograph of the nitride fluorescent material of Example 1 shown in FIG. 3, and the SEM micrograph of the nitride fluorescent material of Comparative Example 1 shown in FIG. 5 and the SEM micrograph of the nitride fluorescent material of Comparative Example 2 shown in FIG. 6 differ in point of appearance. As shown in Table 1, the nitride fluorescent material of Example 1 has a larger mean particle size than that of the nitride fluorescent materials of Comparative Examples 1 and 2, and therefore, it is presumed that the former particles would have somewhat aggregated. From the appearance configuration shown in the SEM micrograph of FIG. 3, it is presumed that the particles of the nitride fluorescent material of Example 1 would have somewhat aggregated, but as shown in Table 1, the light emitting device using the nitride fluorescent material of Example 1 was protected from chromaticity change even after the durability test.

As in the SEM micrograph of the cross section of the nitride fluorescent material of Example 2 shown in FIG. 4, a nitride fluorescent material 1 of Example 2 has a fluorescent material core 2, a first layer 3A of a first film 3, a second layer 3B of the first film 3, and a second film 4, are formed in that order from the side of the fluorescent material core. As shown in FIG. 4, when the first film is formed on the calcined body to be the fluorescent material core, then the second film is formed and thereafter subjected to the second heat treatment, it is presumed that the second film containing a large amount of silicon-oxygen bond (Si—O—Si) could be formed, and further, oxygen contained in the second film would act also on the first film, and it is presumed that the first layer and the second layer each having a different composition would be formed in the first film so that the fluorescent material core could be protected by the three layers of the first layer, the second layer and the second film.

The SEM micrograph of the nitride fluorescent material of Comparative Example 3 shown in FIG. 7 differs in appearance from the SEM micrographs of the nitride fluorescent material of Comparative Example 1 shown in FIG. 5 and the nitride fluorescent material of Comparative Example 2 shown in FIG. 6, and as shown in Table 1, the mean particle size of the nitride fluorescent material of Comparative Example 3 is larger than the mean particle size of the nitride fluorescent materials of Comparative Examples 1 and 2, and therefore it is presumed that the particles of the nitride fluorescent material of Comparative Example 3 would have somewhat aggregated.

As in the SEM micrograph of the reflected electron image of the cross section of the nitride fluorescent material of Comparative Example 3 shown in FIG. 8, a nitride fluorescent material 5 of Comparative Example 3 has a fluorescent material core 6 and has a fluoride-containing film 7 and a second film 8 as formed partly on the surface of the fluorescent material core 6. The nitride fluorescent material 5 of Comparative Example 3 has a part in which the fluoride-containing film 7 could not be clearly distinguished from the second film 8.

As in the SEM micrograph of the cross section of the nitride fluorescent material of Comparative Example 4 shown in FIG. 9, a nitride fluorescent material 11 of Comparative Example 4 has, partly on the surface of a fluorescent material core 12, a fluoride-containing film 13 and a second film 14 formed on the surface of the fluorescent material core 12 in that order from the side of the fluorescent material core 12. Regarding the nitride fluorescent material of Comparative Example 4, after the fluoride-containing film 13 was formed, the second film was formed and was subjected to the second heat treatment, in which, however, the second heat treatment temperature was 250° C. and was low, and therefore oxygen contained in the second film 14 could not sufficiently act on the fluoride-containing film 13, and consequently in the SEM micrograph of the cross section of the nitride fluorescent material, there is seen a part where the fluoride-containing film could not be clearly distinguished from the silica-containing second film.

From the results shown in Table 1, the light emitting devices using the nitride fluorescent material of the present disclosure was more prevented from chromaticity change after the durability test than in Comparative Examples. According to the embodiment of the present disclosure, there can be provided a light emitting device excellent in durability.

The light emitting device using the nitride fluorescent material of the embodiment of the present disclosure is favorably used for light sources for illumination, LED displays, backlight sources for liquid crystal displays, traffic lights, illumination switches, various sensors, various indicators, etc.

The invention claimed is:

1. A nitride fluorescent material comprising, on the surface of a fluorescent material core having a composition comprising at least one element $M^a$ selected from the group consisting of Sr, Ca, Ba and Mg, at least one element $M^b$ selected from the group consisting of Li, Na and K, at least one element $M^c$ selected from the group consisting of Eu, Ce, Tb and Mn, and Al, and optionally Si, and N, a first film comprising a fluoride, and a second film comprising a metal oxide that comprises at least one metal element M2 selected from the group consisting of Si, Al, Ti, Zr, Sn and Zn, wherein:
the first film comprises at least one metal element M2 selected from the group consisting of Si, Al, Ti, Zr, Sn and Zn, and
an amount of the metal element M2 contained in the second film is larger than an amount of the metal element M2 contained in the first film.

2. The nitride fluorescent material according to claim 1, wherein the fluorescent material core has a composition represented by the following formula (I):

$$M^a{}_v M^b{}_w M^c{}_x Al_{3-y} Si_y N_z \quad (I)$$

wherein $M^a$ represents at least one element selected from the group consisting of Sr, Ca, Ba and Mg, $M^b$ represents at least one element selected from the group consisting of Li, Na and K, $M^c$ represents at least one element selected from the group consisting of Eu, Ce, Tb and Mn, v, w, x, y and z each independently represent a number satisfying $0.80 \leq v \leq 1.05$, $0.80 \leq w \leq 1.05$, $0.001 < x \leq 0.1$, $0 \leq y \leq 0.5$, and $3.0 \leq z \leq 5.0$.

3. The nitride fluorescent material according to claim 1, wherein the metal element M2 contained in the first film comprises Si, and the metal element M2 contained in the second film comprises Si.

4. The nitride fluorescent material according to claim 1, wherein the second film comprises fluorine, and an amount of fluorine contained in the first film is larger than an amount of fluorine contained in the second film.

5. The nitride fluorescent material according to claim 1, comprising the first film and the second film in that order from the side of the fluorescent material core.

6. The nitride fluorescent material according to claim 1, wherein the first film comprises a first layer and a second layer in that order from the side of the fluorescent material core, and the first layer and the second layer each comprise a fluoride having a different composition.

7. The nitride fluorescent material according to claim 6, wherein the first layer and the second layer each comprise a fluoride having a composition that comprises fluorine and Al, and the fluoride contained in the first layer has a composition having a larger molar ratio of Al relative to the element $M^a$ than that in the composition of the fluoride contained in the second layer.

8. A light emitting device comprising the nitride fluorescent material of claim 1, and an excitation light source.

* * * * *